(12) United States Patent
Ueyama et al.

(10) Patent No.: US 11,322,907 B2
(45) Date of Patent: May 3, 2022

(54) LIGHT EMITTING ELEMENT HOUSING PACKAGE, LIGHT EMITTING DEVICE, AND LIGHT EMITTING MODULE

(71) Applicant: KYOCERA Corporation, Kyoto (JP)

(72) Inventors: Daisuke Ueyama, Nara (JP); Chiaki Doumoto, Goleta, CA (US); Takeshi Kamikawa, Santa Barbara, CA (US)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/275,964

(22) Filed: Feb. 14, 2019

(65) Prior Publication Data

US 2019/0260179 A1 Aug. 22, 2019

(30) Foreign Application Priority Data

Feb. 16, 2018 (JP) .............................. JP2018-025896
Feb. 16, 2018 (JP) .............................. JP2018-026013

(51) Int. Cl.
| | | |
|---|---|---|
| *H01S 5/0233* | (2021.01) | |
| *H01S 5/023* | (2021.01) | |
| *H01L 23/00* | (2006.01) | |
| *H01S 5/0235* | (2021.01) | |
| *H01S 5/02345* | (2021.01) | |

(Continued)

(52) U.S. Cl.
CPC .............. *H01S 5/023* (2021.01); *H01L 24/00* (2013.01); *H01S 5/0233* (2021.01); *H01S 5/0235* (2021.01); *H01S 5/02345* (2021.01); *H01S 5/02216* (2013.01); *H01S 5/02469* (2013.01)

(58) Field of Classification Search
CPC ............ H01S 5/02236; H01S 5/02276; H01S 5/02216; H01S 5/02469; H01S 5/023; H01S 5/0233; H01S 5/02345; H01S 5/0235; H01L 24/00; H01L 33/62; H01L 2224/32227; H01L 2224/48227;
(Continued)

(56) References Cited

U.S. PATENT DOCUMENTS

| | | | | |
|---|---|---|---|---|
| 4,807,238 A | * | 2/1989 | Yokomori | .............. H01L 33/60 257/E33.072 |
| 6,778,576 B1 | * | 8/2004 | Acklin | ................ H01S 5/02248 372/101 |

(Continued)

FOREIGN PATENT DOCUMENTS

| | | |
|---|---|---|
| JP | 07-038208 A | 2/1995 |
| JP | 2003-218448 A | 7/2003 |

*Primary Examiner* — Xinning(Tom) Niu
(74) *Attorney, Agent, or Firm* — Volpe Koenig

(57) ABSTRACT

A light emitting element housing package of the present disclosure includes a base part including a first surface including a first recessed part for mounting a light emitting element. Surface roughness Sa of at least such a region of a bottom surface of the first recessed part that is opposite to a light emitting element mounted on the first recessed part is smaller than surface roughness Sa of a region other than the first recessed part of the first surface. Further, a light emitting device of the present disclosure includes the light emitting element housing package and a light emitting element housed in the light emitting element housing package. Further, a light emitting module of the present disclosure includes the light emitting device and a module substrate on which the light emitting device is mounted.

14 Claims, 12 Drawing Sheets

(51) Int. Cl.
*H01S 5/024* (2006.01)
*H01S 5/02216* (2021.01)

(58) Field of Classification Search
CPC ......... H01L 33/486; H01L 2224/85439; H01L 2224/85447; H01L 2224/85464
See application file for complete search history.

(56) References Cited

U.S. PATENT DOCUMENTS

2005/0213628 A1* 9/2005 Kishimoto ............. G11B 7/127
372/46.01
2014/0112363 A1* 4/2014 Feitisch .............. H01S 5/02365
372/43.01
2017/0284634 A1* 10/2017 Kiyota ................... F21V 11/00

* cited by examiner

LIGHT EMITTING ELEMENT HOUSING PACKAGE, LIGHT EMITTING DEVICE, AND LIGHT EMITTING MODULE

CROSS-REFERENCE TO RELATED APPLICATION

This application claims priority to Japanese Patent Application Nos. 2018-026013, which was filed on Feb. 16, 2018, and 2018-025896, which was filed on Feb. 16, 2018, the contents of which are incorporated herein by reference in its entirety.

BACKGROUND OF THE INVENTION

1. Field of the Invention

The present disclosure relates to a package for housing an electronic component or a light emitting element, a light emitting device, and a light emitting module.

2. Description of Related Art

For example, in Japanese Unexamined Patent Publication JP-A 7-38208 (1995), disclosed is a semiconductor laser device in which a laser diode pellet (an LD pellet) is fixed and mounted on a stem via a sub-mount substrate (a substrate for a module).

Further, disclosed is a light emitting module which includes a plurality of optical semiconductor devices including an optical semiconductor element such as a semiconductor laser element or a light emitting diode element (for example, refer to Japanese Unexamined Patent Publication JP-A 2003-218448).

SUMMARY OF THE INVENTION

In such a device, heat radiation is required to be improved.

A light emitting module of a related art is configured to mount an optical semiconductor device in which a semiconductor laser element is housed in an element housing package such as a TO-CAN type package on a substrate, however it is difficult to perform further integration in consideration of dimensions and heat radiation properties of the element housing package. Therefore, a compact-sized light emitting module having a large amount of light is required.

An object of the present disclosure is to provide a package for housing a light emitting element having high heat conductivity, and to provide a light emitting device and a light emitting module excellent in heat radiation using the same.

A light emitting element housing package of the present disclosure may include a base part including a first surface including a first recessed part for mounting a light emitting element, surface roughness Sa of at least such a region of a bottom surface of the first recessed part that is opposite to a light emitting element mounted on the first recessed part being smaller than surface roughness Sa of a region other than the first recessed part of the first surface.

A light emitting device of the present disclosure may include the light emitting element housing package mentioned above and a light emitting element housed in the light emitting element housing package.

Further, a light emitting module of the present disclosure may include the light emitting device mentioned above and a module substrate on which the light emitting device is mounted.

Since the light emitting element housing package of the present disclosure has high heat conductivity, even a light emitting element having a large amount of heat generation can be stably mounted thereon. Further, the light emitting device and the light emitting module on which the light emitting element housing package is mounted can be used as a light emitting device and a light emitting module excellent in heat radiation.

BRIEF DESCRIPTION OF THE DRAWINGS

Other and further objects, features, and advantages of the invention will be more explicit from the following detailed description taken with reference to the drawings wherein.

DESCRIPTION OF EMBODIMENTS

Figure 1A:
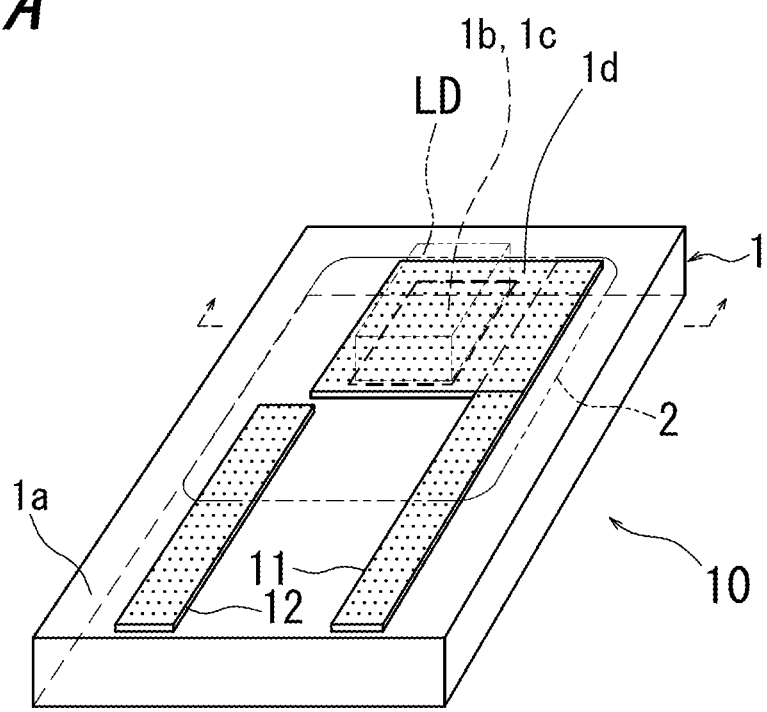
FIGS. 1A and 1B are a perspective view and a cross-sectional view which illustrate a configuration of a light emitting element housing package according to a first embodiment.
Figure 1B:
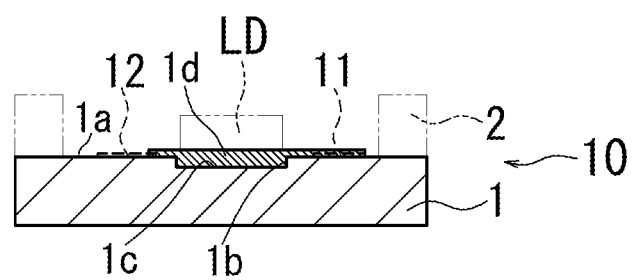
Figure 2A:
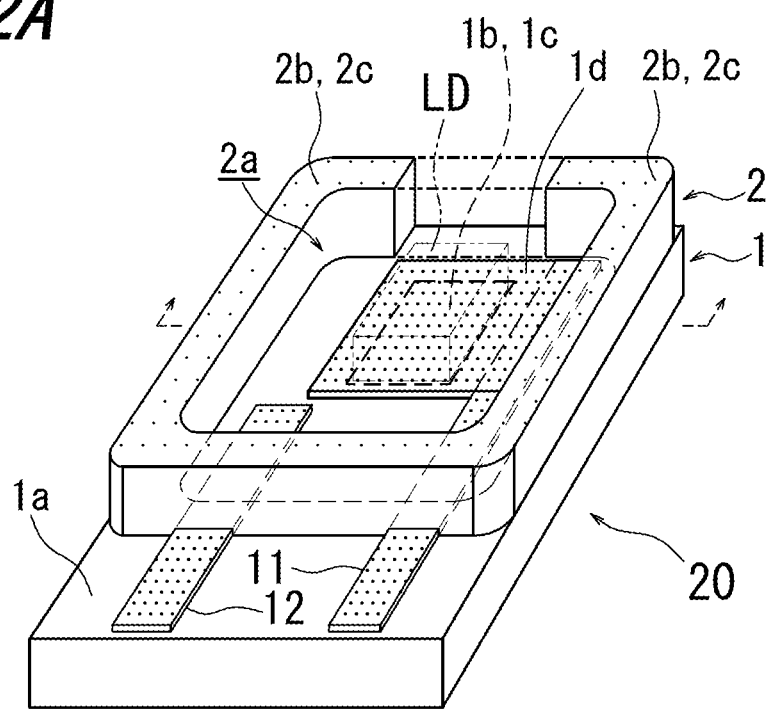
FIGS. 2A and 2B are a perspective view and a cross-sectional view which illustrate a configuration of a light emitting element housing package according to a second embodiment.
Figure 2B:
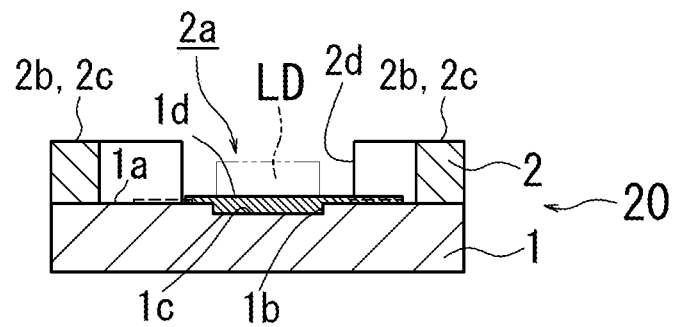

Hereinafter, an example of a light emitting element housing package of the present disclosure will be described with reference to the accompanying drawings. FIGS. 1A and 1B are a perspective view and a cross-sectional view which illustrate a light emitting element housing package according to a first embodiment, and FIGS. 2A and 2B are a perspective view and a cross-sectional view which illustrate a light emitting element housing package according to a second embodiment. The same reference sign will be denoted to a member having the same function in the similar drawing, and a detailed description thereof will be omitted.

A light emitting element housing package 10 according to the first embodiment illustrated in FIGS. 1A and 1B is the most basic configuration which will be also used in each of the following embodiments. The light emitting element housing package 10 includes a base part (an element substrate 1) having a flat plate shape or a substantially rectangular parallelepiped shape; a first wiring conductor 11 and a second wiring conductor 12 which are located on a first surface 1a which is an upper surface of the element substrate 1; and a metal film (a conductor layer 1d) located in an element mounting region at a center part in a width direction (a left and right direction in the drawing) of the element substrate 1.

The first wiring conductor 11, the second wiring conductor 12, and the conductor layer 1d are formed of, for example, a sintered body of metal powder such as tungsten, molybdenum, copper, silver or silver palladium. The conductor layer 1d may be a laminated film formed of gold constituting its outermost surface and a metal containing titanium or the like, and may be formed by vacuum evaporation.

The element substrate 1 is formed of, for example, an insulating material which is a ceramic material such as ceramics such as aluminum nitride (AlN) or alumina (Al$_2$O$_3$), or glass ceramics. The element substrate 1 may be manufactured integrally by using the insulating material, or may be manufactured by laminating a plurality of insulating layers formed of the insulating material.

On the first surface 1a which is a light emitting element mounting surface on the upper surface of the element substrate 1, as illustrated in the cross-sectional view of FIG. 1B, a first recessed part 1b corresponding to an outer shape of the light emitting element is formed directly under a light emitting element mounting region which is opposite to the light emitting element (indicated by a reference sign LD and a virtual line, that is, a two-dot chain line). In addition, surface roughness Sa of a bottom surface 1c of the first recessed part 1b is smaller than surface roughness Sa of the first surface 1a other than the first recessed part 1b.

Specifically, the surface roughness Sa of the bottom surface 1c opposite to the light emitting element LD is equal to or less than 0.1 µm, and the surface roughness Sa of the first surface 1a other than the first recessed part 1b is about 1 µm.

A flat surface whose surface roughness Sa is equal to or less than 0.1 µm may be hereinafter referred to as a "flat surface" in some cases. The "surface roughness Sa" described above is measured in accordance with ISO 25178. As a measurement instrument, a laser microscope, a scanning probe microscope (SPM), and the like are used.

Further, the surface roughness of the first recessed part 1b can be adjusted by performing polishing using plasma, and by transferring the flat surface thereof (a mirror surface) to the bottom surface 1c by using a molding die in which surface roughness Sa of a surface corresponding to the bottom surface 1c is equal to or less than 0.1 µm when performing substrate molding. Further, by the method described above, it is possible to form a recessed part whose average depth from a surface of the first surface 1a (a height reference surface of the substrate surface) is equal to or more than 100 nm and equal to or less than 50 µm.

Further, the first recessed part 1b may be used for determining a position of the light emitting element LD or aligning an optical axis (alignment) in such a manner that a depth of the first recessed part 1b is set to about 1 µm to 200 µm, and a bottom part or a bottom surface of the light emitting element LD is fitted into the first recessed part 1b having the aforementioned depth.

According to the configuration described above, the position determination accuracy of the light emitting element LD and the heat conduction between the light emitting element LD and the element substrate 1 via the conductor layer 1d are improved more than a conventional one in which the bottom surface 1c is not flat. Therefore, heat radiation of heat emitted from the light emitting element LD can be efficiently performed toward the element substrate 1 on the lower side.

Since the first surface 1a other than the first recessed part 1b is a non-flat surface with a large surface area in which the surface roughness Sa thereof exceeds 0.1 µm, heat radiation effect toward an upper side of the element substrate 1 is maintained without change.

Further, in the light emitting element LD, a metal film (for example, gold, etc.) which is the same as the conductor layer 1d may be formed on a surface of a side abutting on the first recessed part 1b (a bottom surface or a surface on the lower side). Accordingly, the heat conduction between the light emitting element LD and the element substrate 1 can be further improved.

A light emitting element housing package 20 according to a second embodiment illustrated in FIGS. 2A and 2B, in addition to the configuration of the light emitting element housing package 10, includes a frame part (a frame body 2) surrounding a periphery of the first recessed part 1b on the first surface 1a which is an upper surface. A space in the frame body 2 serves as a second recessed part 2a for housing the light emitting element LD. Further, an upper end surface 2b of the frame body 2 serves as a sealing surface on which a sealing member (a lid body 3 which will be described later) for sealing opening of the second recessed part 2a is mounted.

A metal film 2c for improving heat conductivity of the upper end surface 2b is located on the upper end surface 2b of the frame body 2, however, in a cross-sectional view of FIG. 2B, a description thereof is omitted.

Further, a cutout 2d on a far side in the drawing of the frame body 2 is located corresponding to a light emitting element mounting region (on the conductor layer 1d) in the light emitting element housing package 20, and is formed so that light emission such as a laser beam can pass through from the cutout 2d toward a rear side in the drawing. A transparent and translucent block such as a glass material or a resin material is located in the cutout 2d for sealing (encapsulating) the second recessed part 2a.

Further, in order to seal (encapsulate) upper surface opening of the second recessed part 2a, the sealing member (the lid body 3 which will be described later) abutting on the upper end surface 2b is located on an upper side of the frame body 2.

Even by the configuration described above, the heat conduction between the light emitting element LD and the element substrate 1 via the conductor layer 1d is improved more than the conventional one in which the bottom surface 1c is not flat. Therefore, the heat radiation of the heat emitted from the light emitting element LD can be efficiently performed toward the element substrate 1 on the lower side.

Further, since the metal film 2c is located on the upper end surface 2b of the frame body 2 in the light emitting element housing package 20, it is possible to efficiently perform heat radiation toward the sealing member located on the upper side thereof.

A configuration method of the metal film 2c on the upper end surface 2b of the frame body 2 is not limited. The metal film 2c may be formed by vacuum evaporation, firing, or otherwise of a metal material, or may be formed in such a manner that a metal plate, or the like is located to be interposed between the lid body 3 and the upper end surface 2b. Further, the metal film 2c is formed of, for example, metal such as gold, tungsten, molybdenum, copper, silver or silver palladium. Particularly, gold having high heat conductivity can be appropriately used.

Further, the upper end surface 2b of the frame body 2 which becomes abase of the metal film 2c may be a flat surface whose surface roughness Sa is smaller than other portions. Specifically, the surface roughness Sa of the upper end surface 2b may be equal to or less than 0.1 µm. Accordingly, the heat conduction can be further improved.

Figure 3A:
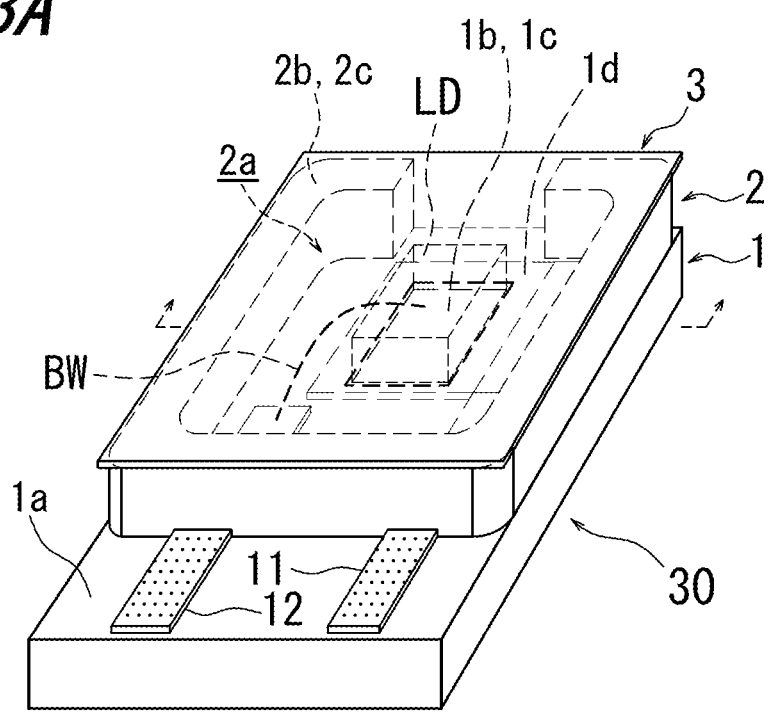
FIGS. 3A and 3B are a perspective view and a cross-sectional view which illustrate a configuration of a light emitting device according to a third embodiment.
Figure 3B:
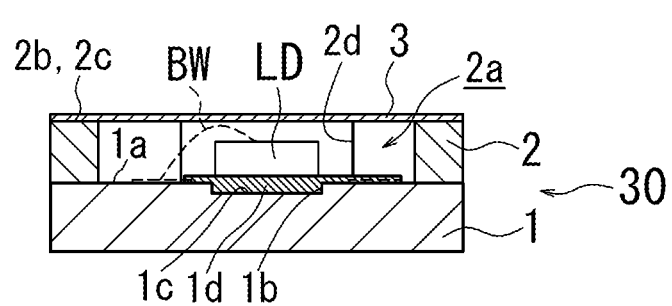

Next, in a light emitting device 30 according to a third embodiment illustrated in FIGS. 3A and 3B, the light emitting element LD is mounted at a predetermined position (a mounting position) of the light emitting element housing package 20 described above (the second embodiment), and further, an electrode on the upper side of the light emitting element LD is connected to the second wiring conductor 12 via a bonding wire BW. Further, an electrode on the lower side of the light emitting element LD is connected to the first wiring conductor 11 via the above-mentioned metal film (the conductor layer 1d).

Further, the metal lid body 3 is mounted on the frame body 2 of the light emitting device 30 on which the light emitting element LD is mounted, and the heat generated from the light emitting element LD is transmitted toward the lid body 3 via the above-mentioned metal film 2c.

Even by the configuration described above, the heat generated from the light emitting element LD is efficiently radiated toward the element substrate 1 on the lower side and toward the lid body 3 on the upper side, respectively. Accordingly, in the light emitting device 30 according to the third embodiment, the heat radiation of the heat emitted from the light emitting element LD is effectively performed, and thus consequently, temperature of the light emitting element LD can be lowered. Further, a lifespan of the light emitting element LD can be improved by lowering the temperature of the light emitting element LD.

Further, in the light emitting element LD, a metal film (for example, gold, etc.) which is similar to the conductor layer 1d may be formed on a surface of a side abutting on the first recessed part 1b (a bottom surface or a surface on the lower side). Accordingly, the heat conduction between the light emitting element LD and the element substrate 1 can be further improved.

Figure 4:
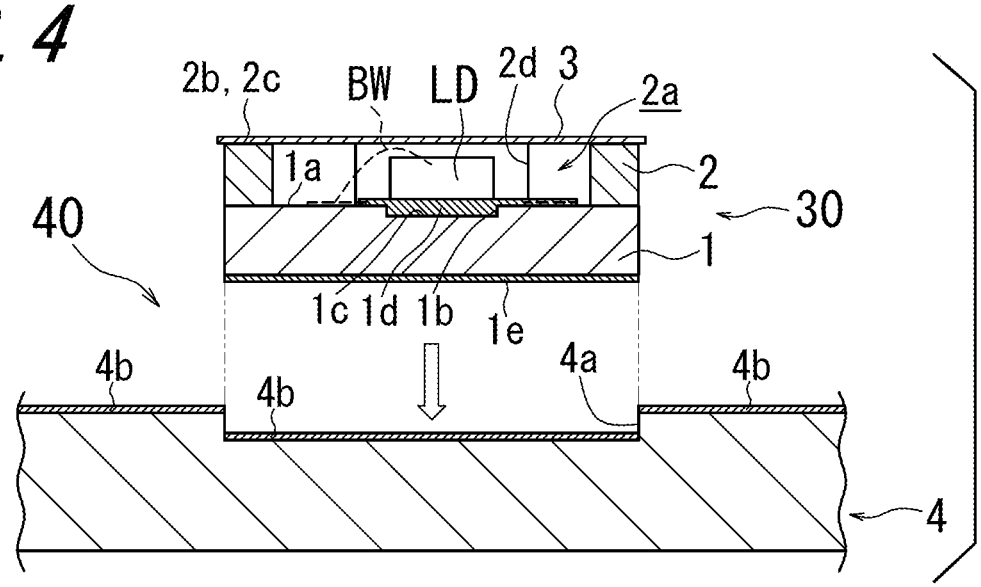
FIG. 4 is an exploded cross-sectional view illustrating a configuration of a light emitting module according to a fourth embodiment.

Next, a light emitting module 40 according to a fourth embodiment illustrated in FIG. 4 is configured to mount the light emitting device 30 according to the third embodiment on a module substrate 4 on which a plurality of the light emitting devices 30 can be mounted. A plurality of third recessed parts 4a as illustrated in the drawing are formed on the module substrate 4.

The third recessed part 4a of the module substrate 4 is formed in a shape capable of being fitted into a bottom part or a bottom surface of the light emitting device 30. Further, a metal film 4b which is similar to the metal film 2c, and the like described above is formed on a bottom surface of the third recessed part 4a and an upper surface (a light emitting device mounting surface) of the module substrate 4.

As illustrated in FIG. 4, a metal film 1e which is similar to the metal film 4b may be located on a bottom surface of the element substrate 1 fitted into the third recessed part 4a. Accordingly, the heat conduction between the element substrate 1 and the module substrate 4 can be improved. Further, the metal film 4b and the metal film 1e are also formed of, for example, metal such as gold, tungsten, molybdenum, copper, silver or silver palladium. Particularly, gold having high heat conductivity can be appropriately used.

Even by the configuration described above, it is possible to form a connection having high heat conductivity between each light emitting device 30 and the module substrate 4. Accordingly, in the light emitting module 40 according to the fourth embodiment, the heat radiation of the heat emitted from the light emitting element LD is effectively performed, and thus consequently, temperature of the light emitting element LD can be lowered. Further, a lifespan of the light emitting element LD can be improved by lowering the temperature of the light emitting element LD.

Further, the light emitting module 40 according to the fourth embodiment can position and fix each light emitting device 30 in such a manner that an optical axis of each light emitting device 30 is accurately aligned at a predetermined position by fitting the light emitting device 30 into the third recessed part 4a of the module substrate 4. Therefore, it is advantageously possible to improve productivity and yield of the light emitting device 30 and the light emitting module 40.

Further, the metal film 1e on the bottom surface of the element substrate 1 and a surface which is a base of the metal film 4b on the upper surface of the module substrate 4 may be formed as a flat surface, the surface roughness Sa of which is smaller than other parts. Specifically, the surface roughness Sa of the base surface thereof may be equal to or less than 0.1 µm. Accordingly, the heat conduction can be further improved.

Figure 5:
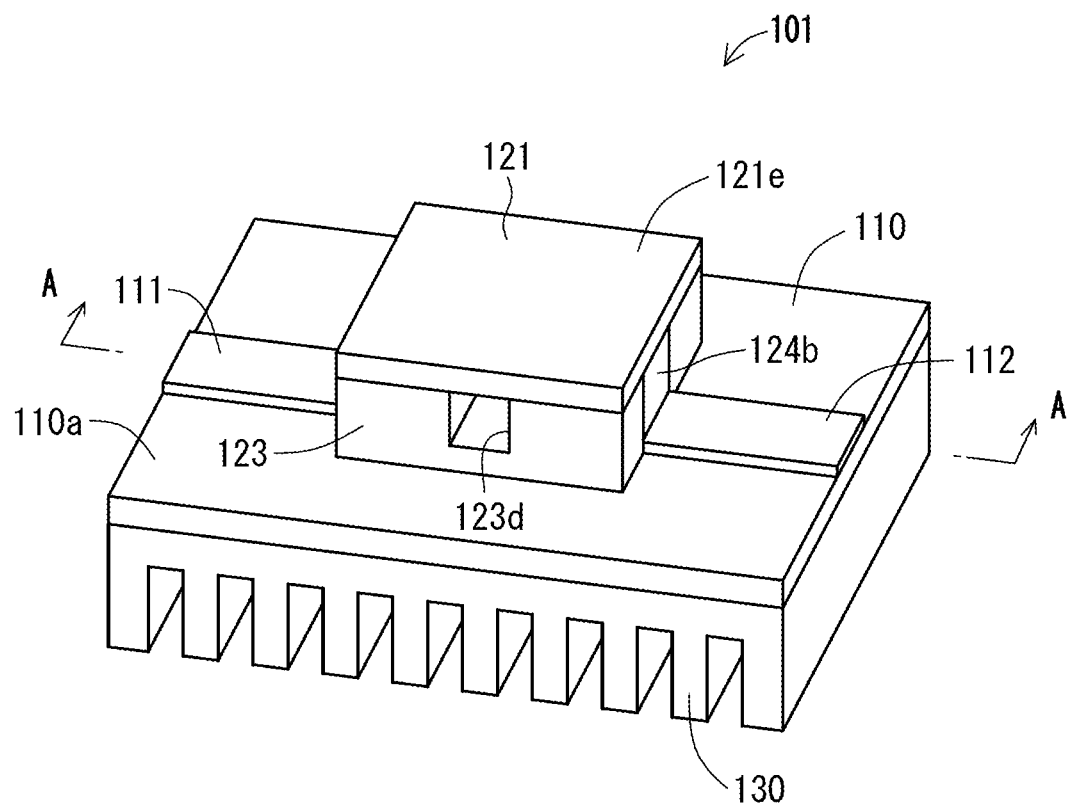
FIG. 5 is a perspective view illustrating an extracted part of an optical module according to the present embodiment.
Figure 6:
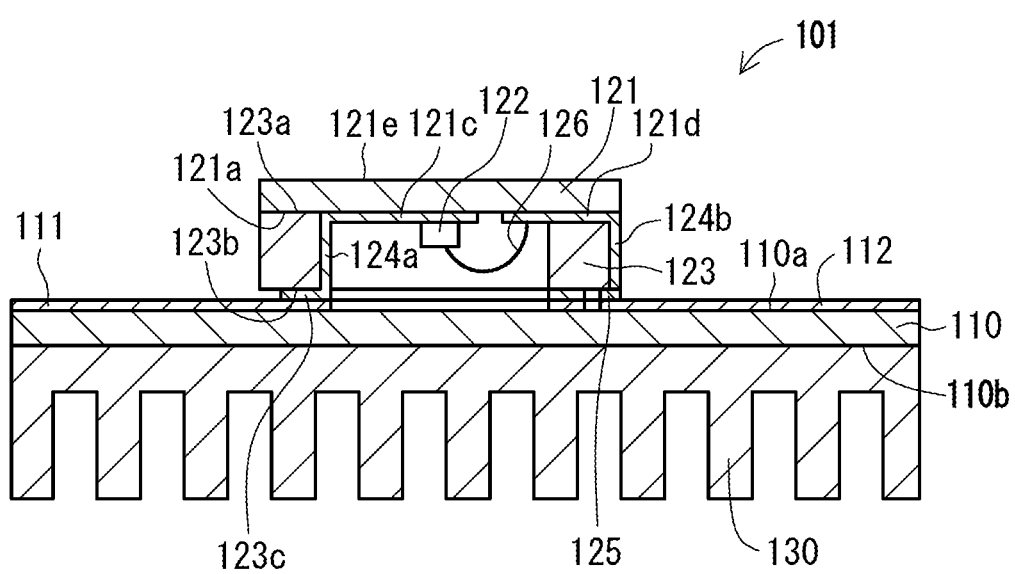
FIG. 6 is across sectional view taken along a line A-A of FIG. 5.
Figure 7:
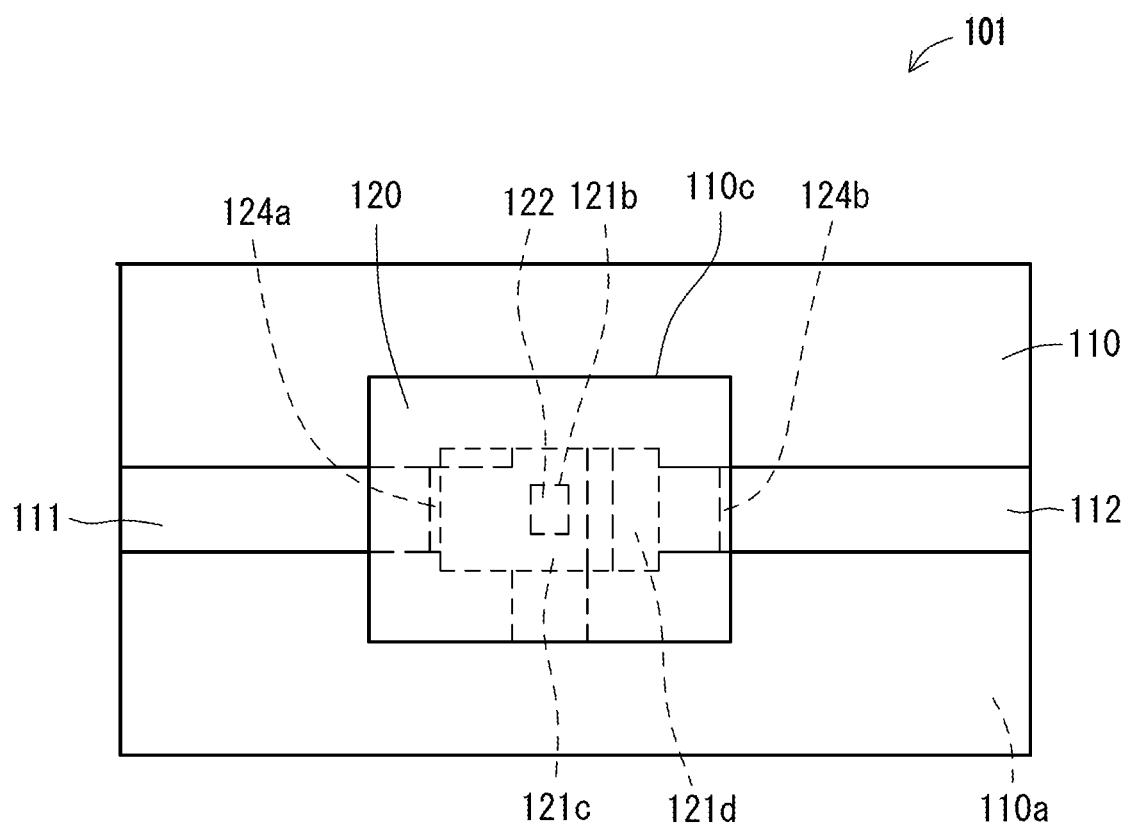
FIG. 7 is a plan view illustrating the extracted part of the optical module according to the present embodiment.
Figure 8:
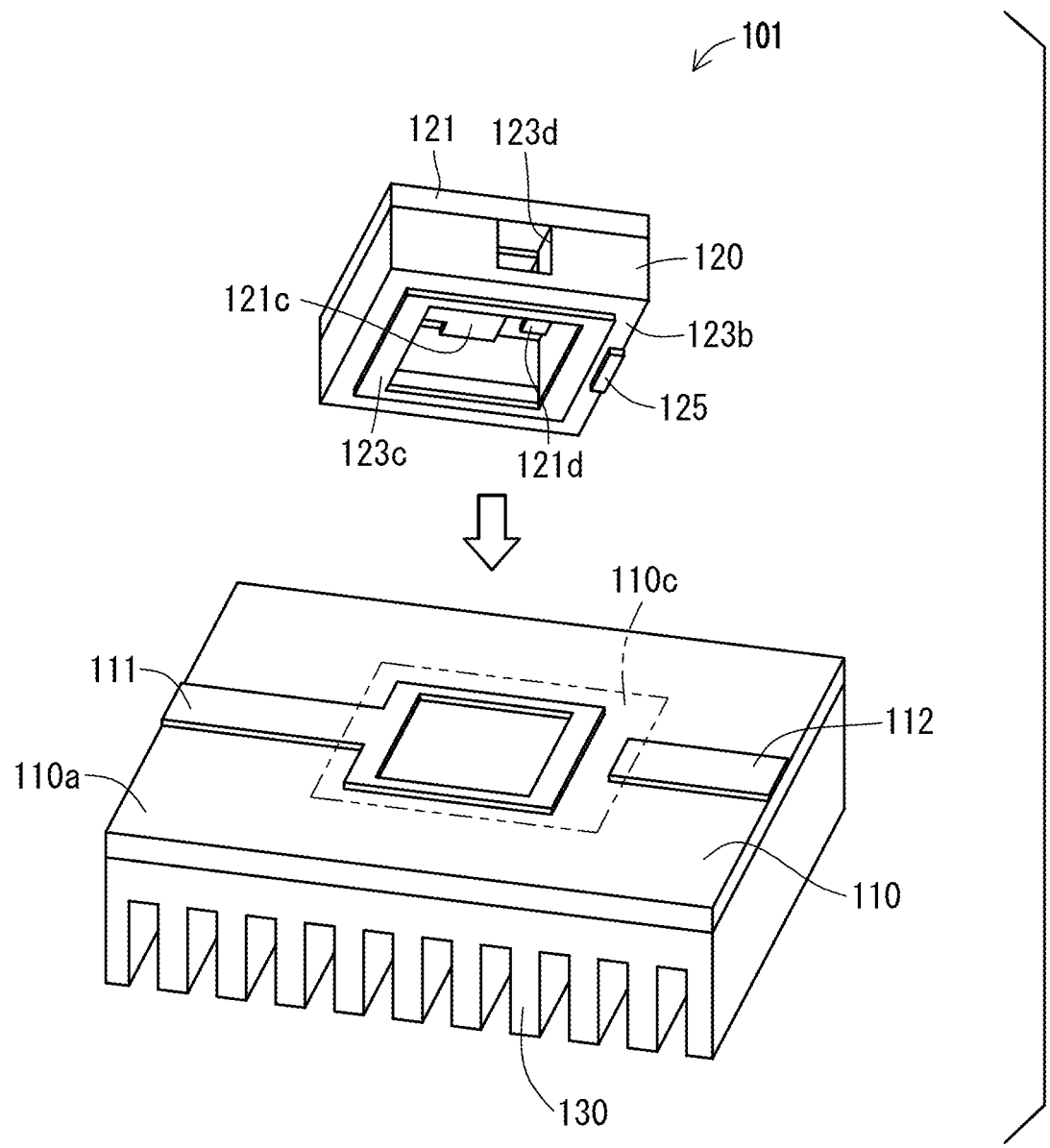
FIG. 8 is an exploded perspective view illustrating the extracted part of the optical module according to the present embodiment.
Figure 9:
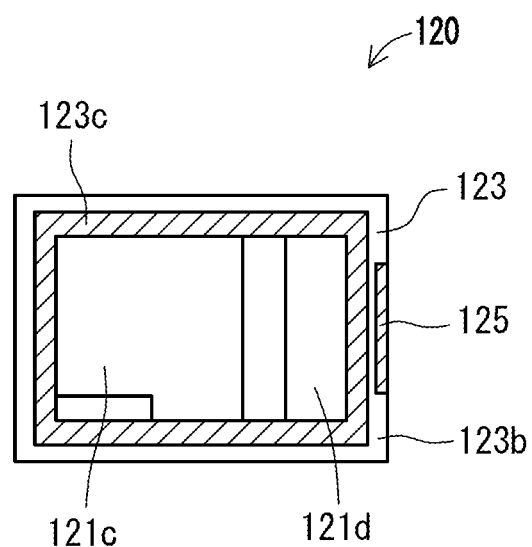
FIG. 9 is a plan view illustrating a configuration of a frame part in the optical module according to the present embodiment.
Figure 10:
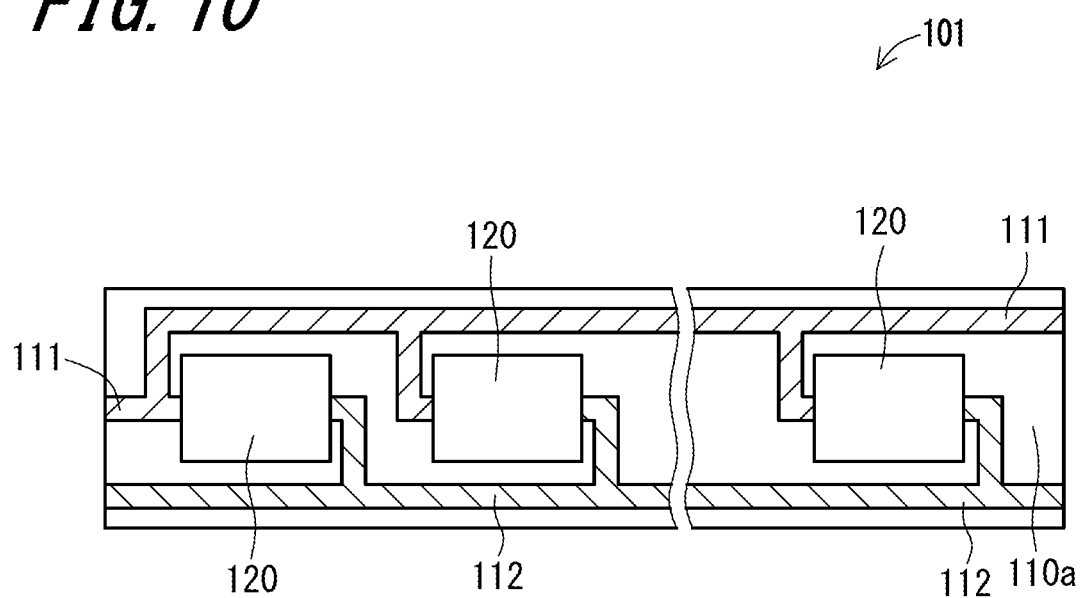
FIG. 10 is a plan view illustrating the optical module according to the present embodiment.

FIG. 5 is a perspective view illustrating an extracted part of an optical module which is a light emitting module according to the present embodiment; FIG. 6 is a cross sectional view taken along a line A-A of FIG. 5. FIG. 7 is a plan view illustrating the extracted part of the optical module according to the present embodiment; FIG. 8 is an exploded perspective view illustrating the extracted part of the optical module according to the present embodiment; FIG. 9 is a plan view illustrating a configuration of a frame part in the optical module according to the present embodiment; and FIG. 10 is a plan view illustrating the optical module according to the present embodiment. Further, in FIGS. 8 and 9, illustration of an optical semiconductor element is omitted. Further, a hatching part in FIG. 9 indicates a metal layer and a connecting conductor, and a hatching part in FIG. 10 indicates a first metal pattern and a second metal pattern.

An optical module 101 according to the present embodiment includes a substrate 110 which is a module substrate;

and one or more optical semiconductor devices 120, which are light emitting devices, mounted on the substrate 110.

The substrate 110 is a flat plate shape and is formed of an insulating material. As illustrated in FIGS. 5 and 6, the substrate 110 includes one main surface 110a and the other main surface 110b opposite to one main surface 110a. One or more mounting regions 110c on which one or more optical semiconductor devices 120 are respectively mounted are located on one main surface 110a. As illustrated in FIGS. 7 and 8, a first metal pattern 111 and a second metal pattern 112 are located in each mounting region 110c.

The first metal pattern 111 and the second metal pattern 112 are electrically connected to an external wiring substrate by a wiring conductor located on the surface of or in the inside of the substrate 110. The external wiring substrate is formed of, for example, a resin material such as a glass epoxy resin, and a control element for controlling an optical output of the optical semiconductor device 120 is mounted thereon.

The substrate 110 is formed of, for example, an insulating material which is a ceramic material such as ceramics such as aluminum nitride (AlN) or alumina ($Al_2O_3$), or glass ceramics. The element substrate 110 may be manufactured integrally by using the insulating material, or may be manufactured by laminating a plurality of insulating layers formed of the insulating material. The first metal pattern 111 and the second metal pattern 112 are formed of, for example, metal or the like such as gold, tungsten, molybdenum, copper, silver or silver palladium.

The optical semiconductor device 120 includes a main body part 121, an optical semiconductor element 122, and a frame part 123.

The main body part 121 is a flat plate shape and is formed of the insulating material. The main body part 121 includes a mounting region 121b on which the optical semiconductor element 122 is mounted on a first surface 121a. Further, a first electrode pad 121c and a second electrode pad 121d are located on the first surface 121a. The first electrode pad 121c is located so as to cover the mounting region 121b.

The optical semiconductor element 122 is mounted on the mounting region 121b of the main body part 121. As the optical semiconductor element 122, for example, a semiconductor laser element (LD), a light emitting diode element (LED), a vertical-cavity surface-emitting laser element (VCSEL), and the like can be used.

In the optical module 101 according to the embodiment, the semiconductor laser element is used as the optical semiconductor element 122. The optical semiconductor element 122 is mounted on the mounting region 121b via, for example, a conductive bonding material such as solder so that one electrode of the optical semiconductor element 122 is electrically connected to the first electrode pad 121c. The other electrode of the optical semiconductor element 122 is electrically connected to the second electrode pad 121d by, for example, a bonding wire 126. The optical semiconductor element 122 is located so that light emitted from the optical semiconductor element 122 advances toward a light extraction port (a through hole 123d which will be described later) provided in the frame part 123.

The frame part 123 is formed of the insulating material. The frame part 123 is located on the first surface 121a of the main body part 121 and surrounds the optical semiconductor element 122 mounted on the mounting region 121b of the main body part 121. The frame part 123 includes a first end surface 123a which is located on the first surface 121a and is in close contact with the first surface 121a; and a second end surface 123b located on a side opposite to the first end surface 123a. The frame part 123 includes a metal layer 123c located on the second end surface 123b. As illustrated in FIG. 9, the metal layer 123c has an annular shape and is located over a whole circumference of the second end surface 123b of the frame part 123.

In the embodiment, as illustrated in FIG. 6, the metal layer 123c is electrically connected to the first electrode pad 121c by a side surface electrode 124a located on an inner peripheral surface of the frame part 123. Accordingly, the metal layer 123c is electrically connected to one electrode of the optical semiconductor element 122. The metal layer 123c and the first electrode pad 121c may be electrically connected to each other by a via electrode located inside the frame part 123 instead of the side surface electrode 124a.

In the embodiment, as illustrated in FIG. 9, the metal layer 123c is located only on an inner peripheral edge part of the second end surface 123b, and an outer peripheral edge part of the second end surface 123b is exposed from the metal layer 123c. The connecting conductor 125 is located at the exposed outer peripheral edge part. The connecting conductor 125 is electrically connected to the second electrode pad 121d by a side surface electrode 124b located on an outer peripheral surface of the frame part 123. The connecting conductor 125 and the second electrode pad 121d may be electrically connected to each other by a via electrode located inside the frame part 123 instead of the side surface electrode 124b.

In the metal layer 123c, the whole circumference of the second end surface 123b is bonded to the first metal pattern 111. Accordingly, a space defined by the substrate 110, and the main body part 121 and the frame part 123 of the optical semiconductor device 120 is hermetically sealed. Further, the connecting conductor 125 is bonded to the second metal pattern 112. The bonding of the metal layer 123c and the first metal pattern 111 and the bonding of the connecting conductor 125 and the second metal pattern 112 are performed by using, for example, a conductive bonding material such as solder. Accordingly, the first metal pattern 111 is electrically connected to one electrode of the optical semiconductor element 122, and the second metal pattern 112 is electrically connected to the other electrode of the optical semiconductor element 122. Further, shapes of the first metal pattern 111 and the second metal pattern 112 may be any shape in which the whole circumference of the metal layer 123c can be bonded to the first metal pattern and the connecting conductor 125 can be bonded to the second metal pattern 112. The first metal pattern 111 may be, for example, a solid shape, an annular shape, and the like, or may be other shapes.

The frame part 123 is provided with the through hole 123d which is opened to the inner peripheral surface and the outer peripheral surface of the frame part 123. The through-hole 123d is hermetically sealed by a transparent member having translucency such as glass or resin material. The through hole 123d functions as a light extraction port for extracting the light emitted from the optical semiconductor element 122 to the outside. The through hole 123d may be, for example, a cutout which is formed by cutting out the frame part 123 from the side of the main body part 121 up to the middle of the frame part 123 in a height direction (an up and down direction in FIG. 6).

The main body part 121 and the frame part 123 are formed of, for example, an insulating material which is a ceramic material such as ceramics such as aluminum nitride (AlN) or alumina ($Al_2O_3$), or glass ceramics. The main body part 121 and the frame part 123 may be manufactured integrally by using the insulating material, or may be manufactured by laminating a plurality of insulating layers formed of the insulating material. The main body part 121 and the frame part 123 may be formed by the same insulating material as the insulating material forming the substrate 110.

For example, as illustrated in FIG. 10, the optical module 101 according to the embodiment can have a configuration in which a plurality of optical semiconductor devices 120 are mounted on the substrate 110. In the optical module 101 according to the embodiment, the optical semiconductor device 120 is hermetically sealed and is electrically connected to the substrate 110 by mounting the optical semiconductor device 120 on the mounting region 110c of the substrate 110. According to the optical module 101 according to the embodiment, in comparison with an optical module that is formed by mounting a plurality of optical semiconductor devices which are individually hermetically sealed on the substrate, it is possible to locate the optical semiconductor device 120 with high density, thereby making it possible to achieve a compact-sized optical module having a large amount of light. Further, in the optical module 101 according to the embodiment, since one main surface 110a of the substrate 110 is exposed to a housing space (the space defined by the substrate 110, the main body part 121, and the frame part 123) in which the optical semiconductor element 122 is housed, heat generated when the optical semiconductor device 120 is driven can be efficiently radiated to the outside via the substrate 110, thereby making it possible to achieve an optical module excellent in reliability.

As descried above, the metal layer 123c is configured to be electrically connected to one electrode of the optical semiconductor element 122 via the first electrode pad 121c and the side surface electrode 124a, however, the metal layer 123c may be configured not to be electrically connected to the optical semiconductor element 122. That is, the metal layer 123c may be used only for sealing the optical semiconductor device 120. When the metal layer 123c and one electrode of the optical semiconductor element 122 are not electrically connected to each other, the optical semiconductor device 120 may have a configuration in which, for example, a connecting pad which is connected to the first electrode pad 121c by a penetrating conductor which penetrates the main body part 121 in a thickness direction is located on a second surface 121e of the main body part 121 on the opposite side to the first surface 121a thereof, and the connecting pad and the first metal pattern 111 may be connected to each other by, for example, a bonding wire. Accordingly, a drive signal for driving the optical semiconductor element 122 can be supplied to the first electrode pad 121c.

The optical module 101 according to the embodiment includes a heat radiation member 130. Accordingly, since the optical module 101 can effectively radiate the heat generated when the optical semiconductor device 120 is driven to the outside, the optical semiconductor device 120 can be disposed with a higher density, and thus consequently, a light amount outputted from the optical module 101 can be improved. As illustrated in FIGS. 5 and 6, for example, the heat radiation member 130 is located on the other main surface 110b of the substrate 110. The heat radiation member 130 may be formed by, for example, a metal material containing silver, cooper, tungsten or the like as a main component, wherein the main component means a component having the highest content among the contained components. The surface on which the heat radiation member 130 is located is not limited to the other main surface 110b of the substrate 110, but may be one main surface 110a of the substrate 110 or the side surface of the substrate 110. The wiring conductor for connecting the first metal pattern 111 and the second metal pattern 112 to the external wiring substrate may be configured not to be located on the surface on which the heat radiation member 130 is located. Thus, an area where the substrate 110 and the heat radiation member 130 directly contact each other can be enlarged, whereby the heat generated when the optical semiconductor device 120 is driven can be more effectively radiated to the outside.

Next, modified examples of the optical module 101 according to the embodiment will be described with reference to FIGS. 11A, 11B, and 11C. In the modified examples illustrated in FIGS. 11A, 11B, and 11C, a configuration of the substrate 110 and a mounting position of the optical semiconductor device 120 are different from those of the above-mentioned optical module 101, and other configurations are almost the same as those of the optical module 101, so that only the differences from the optical module 101 will be described.

Figure 11A:
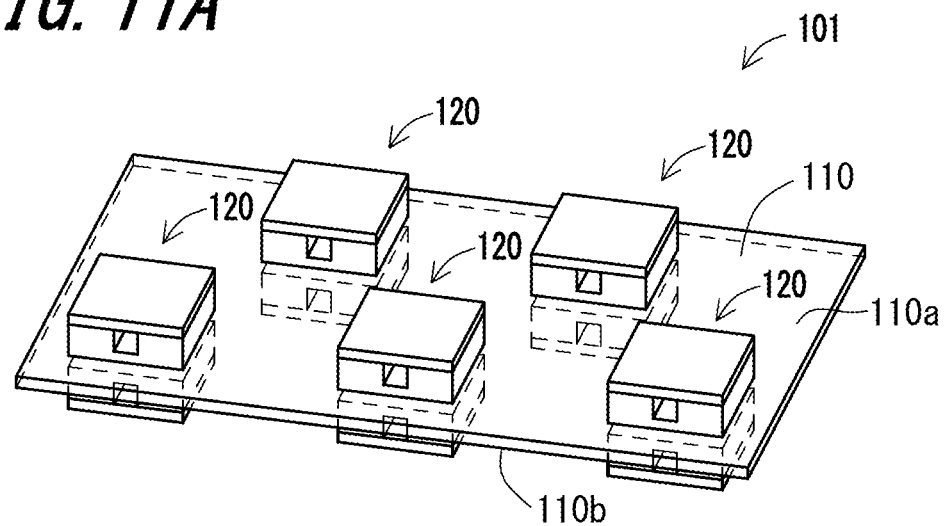
FIG. 11A is a perspective view illustrating a modified example of the optical module according to the present embodiment.

FIG. 11A is a perspective view illustrating a modified example of the optical module 101 according to the present embodiment. As illustrated in FIG. 11A, the optical module 101 may have a configuration in which the plurality of optical semiconductor devices 120 are mounted in a zigzag pattern on one main surface 110a of the substrate 110. The plurality of optical semiconductor devices 120 may be mounted not only on one main surface 110a of the substrate 110, but also on the other main surface 110b in the zigzag pattern. In the present modified example, the zigzag pattern on one main surface 110a and the zigzag pattern on the other main surface 110b may be the same as each other or different from each other.

Figure 11B:
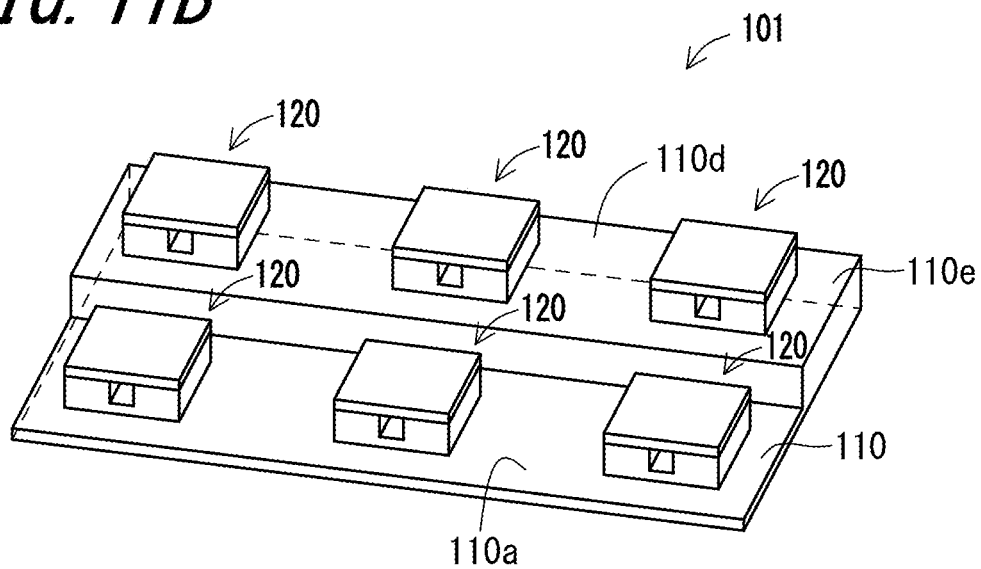
FIG. 11B is a perspective view illustrating another modified example of the optical module according to the present embodiment.

FIG. 11B is a perspective view illustrating another modified example of the optical module 101 according to the present embodiment. As illustrated in FIG. 11B, the optical module 101 may have a configuration in which a stepped part 110d including a stepped surface 110e extending in parallel to one main surface 110a is located on one main surface 110a of the substrate 110, and the plurality of optical semiconductor devices 120 may be mounted not only on the main surface 110a, but also on the stepped surface 110e. In the present modified example, the number of optical semiconductor devices 120 which are mounted on one main surface 110a and the number of optical semiconductor devices 120 which are mounted on the stepped surface 110e may be the same as each other or different from each other.

Figure 11C:
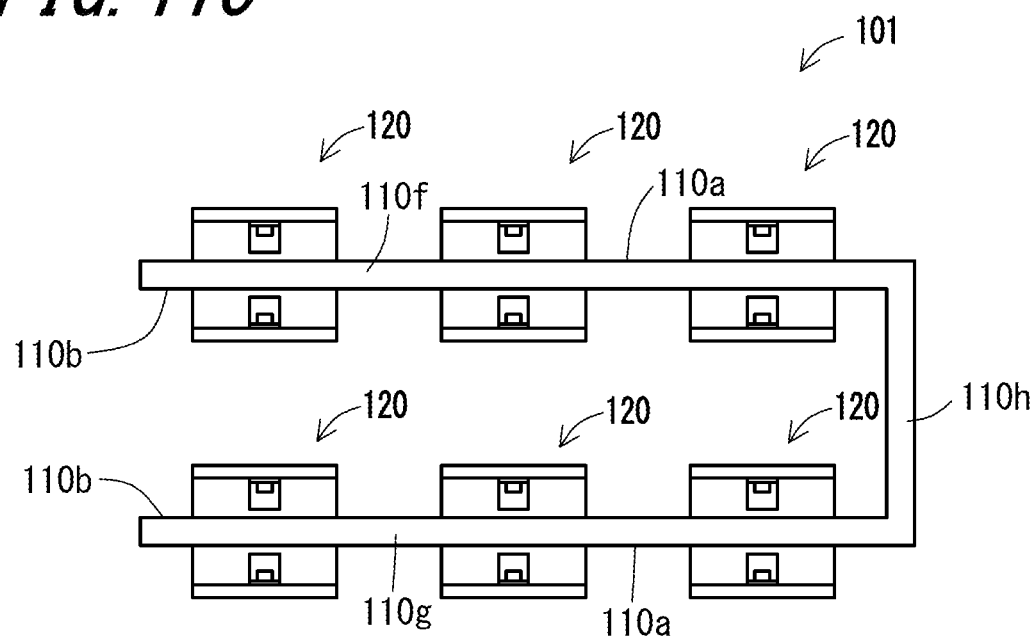
FIG. 11C is a plan view illustrating another modified example of the optical module according to the present embodiment.

FIG. 11C is a plan view illustrating another modified example of the optical module 101 according to the present embodiment. As illustrated in FIG. 11C, the optical module 101 may have a configuration in which the plurality of optical semiconductor devices 120 are mounted on one main surface 110a and the other main surface 110b of the substrate 110, and the substrate 110 may include a bent part 110h which is bent in a U shape so that the other main surface 110b at one end part 110f and the other main surface 110b at the other end part 110g on the opposite side to one end part 110f are opposite to each other. In the present modified example, the optical semiconductor device 120 may not be mounted on the bent part 110h, and the heat radiation member, the external wiring substrate, and the like may be located thereon.

Even by the modified examples illustrated in FIGS. 11A, 11B, and 11C, it is possible to achieve the compact-sized optical module having a large amount of light excellent in reliability.

Next, modified examples of the configuration of the frame part of the optical semiconductor device will be described with reference to FIGS. 12A, 12B, 13A, 13B, 13C, and 13D. FIGS. 12A, 12B, 13A, 13B, 13C, and 13D will be illustrated with omission of the optical semiconductor element 122. Further, hatching parts illustrated in FIGS. 12A, 12B, 13A, 13B, 13C, and 13D indicate the metal layer 123c and the connecting conductor 125.

Figure 12A:
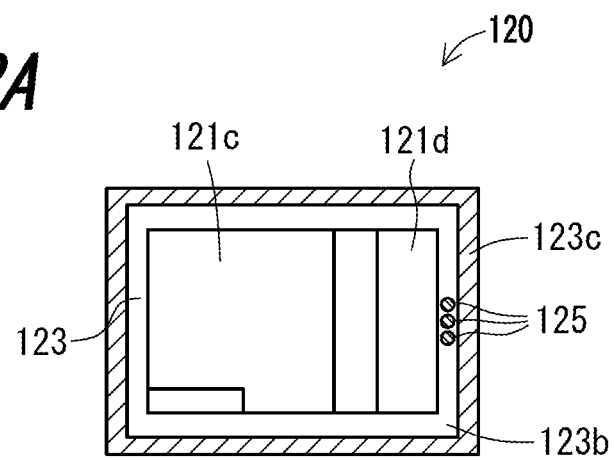
FIG. 12A is a plan view illustrating a modified example of a configuration of a frame part in an optical semiconductor device.

FIG. 12A is a plan view illustrating a modified example of the configuration of the frame part in the optical semiconductor device. In the present modified example, as illustrated in FIG. 12A, the metal layer 123c is located only at an outer peripheral edge part of the second end surface 123b, and an inner peripheral edge part of the second end surface 123b is exposed from the metal layer 123c. The connecting conductor 125 is located at the exposed inner peripheral edge part thereof. As illustrated in FIG. 12A, the connecting conductor 125 in the present modified example includes a plurality of conductors, and the plurality of conductors are electrically connected to the second electrode pad 121d by the via electrode located inside the frame part 123.

Figure 12B:
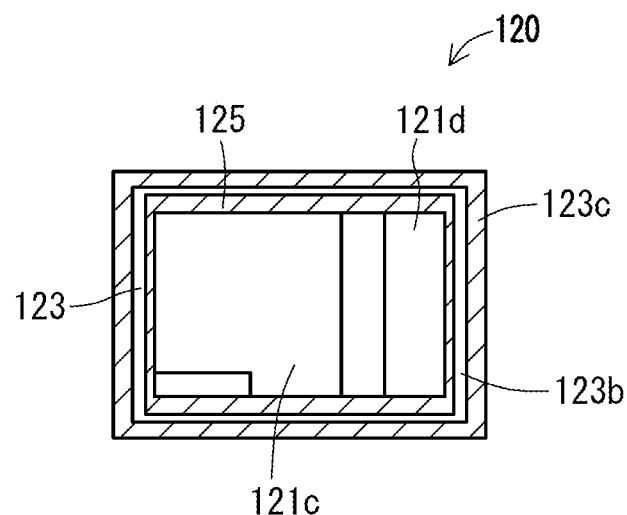
FIG. 12B is a plan view illustrating another modified example of the configuration of the frame part in the optical semiconductor device.

FIG. 12B is a plan view illustrating another modified example of the configuration of the frame part in the optical semiconductor device. As illustrated in FIG. 12B, the connecting conductor 125 may be a conductor having an annular shape located at the exposed inner peripheral edge part of the second end surface 123b. The connecting conductor 125 of the present modified example is electrically connected to the second electrode pad 121d by the via electrode provided inside the frame part 123. The connecting conductor 125 may be electrically connected to the second electrode pad 121d by the side surface electrode located on the inner peripheral surface of the frame part 123.

The second metal pattern 112 in the present modified examples illustrated in FIGS. 12A and 12B may be derived to a position opposite to the connecting conductor 125 in the mounting region 110c through the inside of the substrate 110. Accordingly, when the optical semiconductor device 120 is mounted on the mounting region 110c, the connecting conductor 125 and the second metal pattern 112 are electrically connected to each other.

The metal layer 123c in the present modified examples illustrated in FIGS. 12A and 12B may be configured not to be electrically connected to the optical semiconductor element 122. That is, the metal layer 123c may be used only for sealing the optical semiconductor device 120. When the metal layer 123c and one electrode of the optical semiconductor element 122 are not electrically connected to each other, the following constitution may be adopted. In the optical semiconductor device 120, for example, the connecting pad which is connected to the first electrode pad 121c by the penetrating conductor that penetrates the main body part 121 in the thickness direction is located on the second surface 121e of the main body part 121 on the opposite side to the first surface 121a thereof. And, the connecting pad and the first metal pattern 111 may be connected to each other by, for example, the bonding wire. Accordingly, the drive signal for driving the optical semiconductor element 122 can be supplied to the first electrode pad 121c.

Figure 13A:
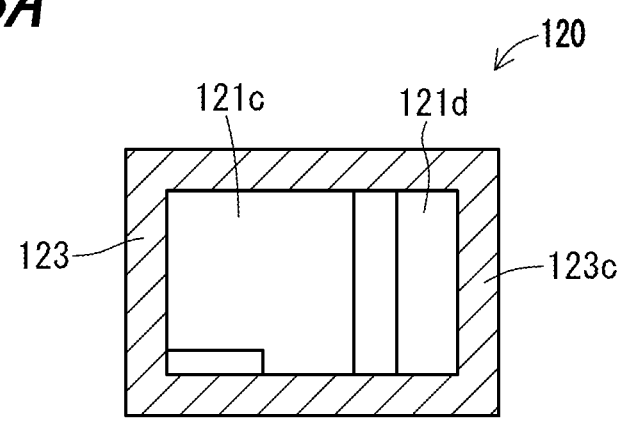
FIG. 13A is a plan view illustrating another modified example of the configuration of the frame part in the optical semiconductor device.

FIG. 13A is a plan view illustrating another modified example of the configuration of the frame part in the optical semiconductor device. In the present modified example, the connecting conductor 125 is not located on the second end surface 123b of the frame part 123, and only the metal layer 123c is located thereon. The metal layer 123c is located on the whole surface of the second end surface 123b. Further, the metal layer 123c is electrically connected to the first electrode pad 121c by the side surface electrode 124a located on the inner peripheral surface of the frame part 123. The metal layer 123c may be electrically connected thereto by the via electrode located inside the frame part 123 instead of the side surface electrode 124a.

In the same manner as the above-mentioned optical module 101, it is possible to achieve the compact-sized optical module having a large amount of light in the present modified example. Further, according to the present modified example, a bonding area between the metal layer 123c and the first metal pattern 111 can be increased. Accordingly, since the bonding between the substrate 110 and the optical semiconductor device 120 can be strengthened, and heat conduction from the optical semiconductor device 120 to the substrate 110 can be promoted, reliability of the optical module can be improved.

When the connecting conductor 125 is not located on the second end surface 123b, the following constitution may be adopted. In the optical semiconductor device 120, for example, a connecting pad which is connected to the second electrode pad 121d by the penetrating conductor which penetrates the main body part 121 in the thickness direction is located on the second surface 121e of the main body part 121 on the opposite side to the first surface 121a thereof. And, the connecting pad and the second metal pattern 112 may be connected to each other by, for example, the bonding wire. Accordingly, the drive signal for driving the optical semiconductor element 122 can be supplied to the second electrode pad 121d.

Figure 13B:
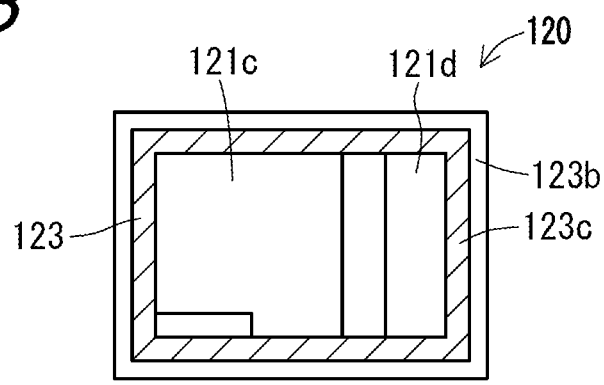
FIG. 13B is a plan view illustrating another modified example of the configuration of the frame part in the optical semiconductor device.
Figure 13C:
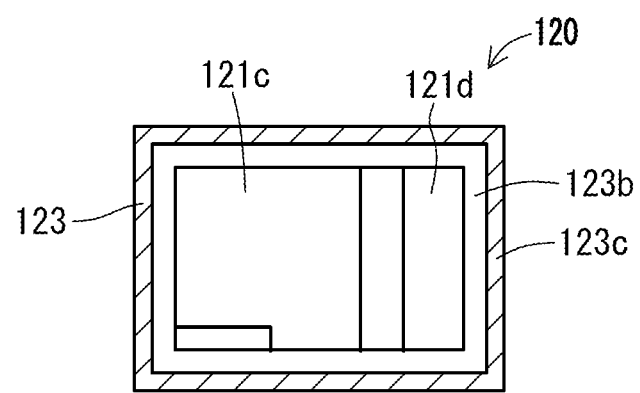
FIG. 13C is a plan view illustrating another modified example of the configuration of the frame part in the optical semiconductor device.
Figure 13D:
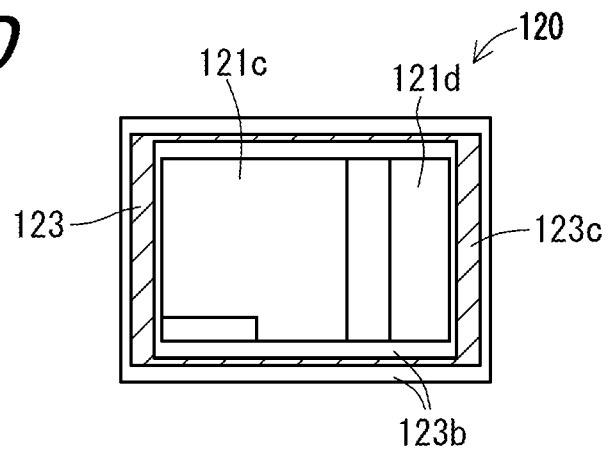
FIG. 13D is a plan view illustrating another modified example of the configuration of the frame part in the optical semiconductor device.

The metal layer 123c may be located over the whole circumference of the second end surface 123b, and may not be located over the whole surface. As illustrated in FIG. 13B, for example, the metal layer 123c may be located only on the inner peripheral edge part of the second end surface 123b, or may be located only on the outer peripheral edge part of the second end surface 123b as illustrated in FIG. 13C. Further, as illustrated in FIG. 13D, the inner peripheral edge part of the second end surface 123b and the outer peripheral edge part thereof may be configured to be exposed from the metal layer 123c. In the same manner as the above-mentioned optical module 101, it is possible to achieve the compact-sized optical module having a large amount of light in the modified examples illustrated in FIGS. 13B, 13C, and 13D.

The present disclosure is not limited to the embodiments described above, and various modifications, improvements, and the like can be performed within the scope without departing from the scope of the present disclosure.

For example, the mounting region 110c on which the optical semiconductor device 120 is mounted may be located not only on one main surface 110a of the substrate 110, but also on the side surface of the substrate 110. Further, the optical semiconductor device 120 may be configured to include two or more optical semiconductor elements 122. Further, two or more optical semiconductor elements 122 may be located so as to emit light in different directions. The frame part 123 may be provided with two or more through holes 123d corresponding to the light emitted from two or more optical semiconductor elements 122 in different directions.

What is claimed is:
1. A light emitting element housing package, comprising:
a base part comprising a first surface comprising a first recessed part for mounting a light emitting element, the light emitting element having an outer shape, the first recessed part of the base part comprising a bottom wall and side walls surrounding the outer shape of the light emitting element, wherein a height of the side walls is lower than a height of the light emitting element, a conductor layer located in an element mounting region of the base part, the conductor layer comprising gold, a film located on an outermost surface of the conductor layer, the film comprising gold, the light emitting element mounted directly to the light emitting element housing package, and wherein a surface roughness Sa of at least a region of a bottom surface of the first recessed part that is opposite to the light emitting element is smaller than a surface roughness Sa of a region of the first surface other than the first recessed part.

2. The light emitting element housing package according to claim 1, wherein the surface roughness Sa of the bottom surface is equal to or less than 0.1 µm, and the surface roughness Sa of the region of the first surface other than the first recessed part is greater than 0.1 µm.

3. The light emitting element housing package according to claim 1, wherein a depth of the bottom surface of the first recessed part from an upper surface of the first surface is equal to or more than 100 nm and equal to or less than 50 µm.

4. The light emitting element housing package according to claim 1, wherein the region opposite to the light emitting element in the bottom surface of the first recessed part comprises a film formed of a metal thereon.

5. The light emitting element housing package according to claim 1, further comprising:

a frame part surrounding a periphery of the first recessed part on the first surface, wherein a space surrounded by the frame part constitutes a second recessed part for housing the light emitting element; and an upper end surface of the frame part constitutes a sealing surface on which a sealing member for sealing opening of the second recessed part is mounted.

6. The light emitting element housing package according to claim 5, wherein a surface roughness Sa of the sealing surface is equal to or less than 0.1 µm.

7. The light emitting element housing package according to claim 5, wherein the sealing surface comprises a film formed of a metal thereon.

8. A light emitting device, comprising:

the light emitting element housing package according to claim 1; and a light emitting element housed in the light emitting element housing package.

9. The light emitting device according to claim 8, wherein the light emitting element comprises a semiconductor laser element.

10. A light emitting module, comprising:

the light emitting device according to claim 8; and a module substrate on which the light emitting device is mounted.

11. The light emitting module according to claim 10, wherein a light emitting device mounting surface of the module substrate comprises a third recessed part for determining a position of the light emitting device.

12. The light emitting module according to claim 11, wherein a surface roughness Sa of a bottom surface of the third recessed part is equal to or less than 0.1 µm.

13. The light emitting module according to claim 11, wherein the bottom surface of the third recessed part comprises a film formed of a metal thereon.

14. The light emitting module according to claim 10, wherein the module substrate comprises one or more mounting regions on which optical semiconductor devices are to be mounted, respectively, and a first metal pattern located in each of the one or more mounting regions, the light emitting device comprises one or more optical semiconductor devices mounted on the one or more mounting regions, respectively, and each of the one or more optical semiconductor devices comprises a main body part comprising a mounting region on a first surface thereof;

an optical semiconductor element mounted on the mounting region; and a frame part surrounding the optical semiconductor element, the frame part comprising a first end surface located on the first surface of the main body part, and a second end surface opposite to the first end surface, the frame part comprising a metal layer located over a whole circumference of the second end surface, a whole circumference of a surface of the metal layer opposite to the second end surface being bonded to the first metal pattern.

* * * * *